(12) United States Patent
Zhang et al.

(10) Patent No.: US 9,595,310 B2
(45) Date of Patent: Mar. 14, 2017

(54) CIRCUITS FOR CONTROL OF TIME FOR READ OPERATION, USING A CURRENT MIRROR CIRCUIT TO MIRROR A REFERENCE CURRENT INTO THE DUMMY DEVICE AND GENERATES TIME CONTROL SIGNALS BASED ON THE MIRRORED CURRENT

(71) Applicant: SHANGHAI HUAHONG GRACE SEMICONDUCTOR MANUFACTURING CORPORATION, Shanghai (CN)

(72) Inventors: Yong Zhang, Shanghai (CN); Jun Xiao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/976,593

(22) Filed: Dec. 21, 2015

(65) Prior Publication Data
US 2016/0307613 A1    Oct. 20, 2016

(30) Foreign Application Priority Data

Apr. 17, 2015    (CN) .......................... 2015 1 0189269

(51) Int. Cl.
| | |
|---|---|
| *G11C 7/00* | (2006.01) |
| *G11C 8/10* | (2006.01) |
| *G11C 7/06* | (2006.01) |
| *G11C 7/08* | (2006.01) |
| *G11C 7/22* | (2006.01) |
| *G11C 16/26* | (2006.01) |
| *G11C 16/32* | (2006.01) |
| *G11C 7/14* | (2006.01) |

(Continued)

(52) U.S. Cl.
CPC ................. *G11C 8/10* (2013.01); *G11C 7/06* (2013.01); *G11C 7/08* (2013.01); *G11C 7/227* (2013.01); *G11C 16/26* (2013.01); *G11C 16/32* (2013.01); *G11C 7/1051* (2013.01); *G11C 7/14* (2013.01); *G11C 16/0483* (2013.01)

(58) Field of Classification Search
CPC ........ G11C 7/1051; G11C 7/22; G11C 7/1072
USPC .......................... 365/189.15, 185.21, 189.07
See application file for complete search history.

(56) References Cited

U.S. PATENT DOCUMENTS

| | | | | |
|---|---|---|---|---|
| 2003/0156457 A1* | 8/2003 | Ooishi | ................ | G11C 11/5671 365/185.21 |
| 2009/0224746 A1* | 9/2009 | Nishizono | .............. | G01D 3/032 323/312 |
| 2016/0189781 A1* | 6/2016 | Zhang | .................... | G11C 16/14 365/185.29 |

* cited by examiner

*Primary Examiner* — Connie Yoha
(74) *Attorney, Agent, or Firm* — Muncy, Geissler, Olds & Lowe, P.C.

(57) ABSTRACT

A circuit for control of time for read operation is disclosed which additionally incorporates a dummy device circuit and a dummy sensitive amplifier circuit, uses a current mirror circuit to mirror a reference current in a reference device circuit into the dummy device circuit to generate a mirrored current, and generates time control signals based on the mirrored current. Due to the same adaptation of the mirrored current to the size of a test device as the reference current, the time control signals are also adapted to the size of the test device. This addresses the problem of fixed time control signals arising from the use of a conventional RC relay circuit and enables the time control signals to change with the size of the test device as well as Process Voltage Temperature, thereby resulting in an effective reduction in average energy consumed in read operation.

7 Claims, 4 Drawing Sheets

(51) Int. Cl.
*G11C 7/10* (2006.01)
*G11C 16/04* (2006.01)

CIRCUITS FOR CONTROL OF TIME FOR READ OPERATION, USING A CURRENT MIRROR CIRCUIT TO MIRROR A REFERENCE CURRENT INTO THE DUMMY DEVICE AND GENERATES TIME CONTROL SIGNALS BASED ON THE MIRRORED CURRENT

CROSS-REFERENCES TO RELATED APPLICATIONS

This application claims the priority of Chinese patent application No. 201510189269.3, filed on Apr. 17, 2015, the entire contents of which are incorporated herein by reference.

TECHNICAL FIELD

The present invention relates to the fabrication of semiconductor devices and, in particular, to circuits for control of time for read operation.

BACKGROUND

During a read operation performed on a flash memory device, a signal generation circuit is generally required to generate a time control signal for allowing read-out of data in a read cycle. Conventionally, the generation of the time control signal is usually accomplished by charging or discharging an RC delay circuit.

Specifically, referring to FIG. 1, which is a schematic circuit diagram of a conventional sensitive amplifier (SA) including a pMOS transistor (P), an nMOS transistor (N) and two inverters (T1 and T2), the pMOS transistor has a drain coupled to an input terminal of the inverter T1, and the inverter T1 has an output terminal that serves as a data output terminal (Dout). A gate of the pMOS transistor is coupled to a time control signal (Precharge). The nMOS transistor has a source coupled to the drain of the pMOS transistor, a drain coupled to an input terminal of the inverter T2 and a gate coupled to an output terminal of the inverter T2, thereby forming a leading inverter. The sensitive amplifier is connected to a test device (Cell) in order to read data therefrom.

FIG. 2 shows a time sequence diagram of the sensitive amplifier circuit performing a data readout operation. At the beginning of the data readout operation, the pMOS transistor is switched on so that a bit-line capacitor (Cbl) or a word-line capacitor (Cwl) of the test device is pre-charged to a threshold voltage of the nMOS transistor. This process requires a time control signal Tpre. After the completion of the pre-charging, the sensitive amplifier circuit performs a current comparison with respect to the level E, i.e., comparing a current Icell flowing in the test device and a reference current Iref. In most cases, Icell is greater than Iref, therefore necessitating the discharge of Icell to a value close to Iref (as indicated by the dashed line in FIG. 2). In other words, the data readout is allowed after the level E is close to zero. Therefore, the data readout cycle requires two time control signals, i.e., Tpre and Twait.

Referring to FIG. 3, which is a schematic diagram of a conventional RC delay circuit, the circuit includes a resistor r, capacitors Cp and Cn and inverters T1 and T2. The RC delay circuit is configured to generate the time control signals Tpre and Twait through charge or discharge of the capacitors.

FIG. 4 is a schematic showing the conventional sensitive amplifier circuit SA (same as the SA circuit shown in FIG. 1) in connection with a test device. Typically, the test device includes a word line decoder (WL_decoder), a bit line decoder (bl_decoder), a word line capacitor (C_wl) and a bit line capacitor (C_bl). Differently-sized test devices have word line capacitors and bit line capacitors with different sizes which require different pre-charge times. That is, Tpre and Twait vary depending on the word line capacitors (C_wl) and the bit line capacitors (C_bl). However, as the RC delay circuit is fabricated with fixed resistor and capacitors values, it is incapable of generating different sets of time control signals Tpre and Twait and thus cannot meet the requirements of different test devices.

SUMMARY OF THE INVENTION

It is therefore an objective of the present invention to provide a circuit for control of time for read operation, which is capable of automatic generation of time control signals adapted to test devices with different sizes and thereby allows readout of data therefrom.

To this end, the present invention proposes a circuit for control of time for read operation, including a reference device circuit, a current mirror circuit, a dummy device circuit and a dummy sensitive amplifier circuit. The current mirror circuit is configured to mirror a reference current in the reference device circuit into the dummy device circuit to generate a mirrored current, and the dummy sensitive amplifier circuit is in connection with the dummy device circuit and is configured to generate time control signals according to the mirrored current in the dummy device circuit.

Further, in the circuit for control of time for read operation, the dummy sensitive amplifier circuit may include a first pMOS transistor, a first nMOS transistor, a second nMOS transistor, a first inverter and a second inverter; the first pMOS transistor has a source coupled to a power supply voltage, a drain coupled to both of an input terminal of the first inverter and a source of the first nMOS transistor and a gate coupled to an address control signal; the first nMOS transistor and the second nMOS transistor have a common gate coupled to an output terminal of the second inverter; the second nMOS transistor has a source coupled to the power supply voltage and a drain coupled to both of the drain of the first nMOS transistor and an input terminal of the second inverter; and the input terminal of the second inverter is in connection with the dummy device circuit.

Further, in the circuit for control of time for read operation, the dummy device circuit may include a first capacitor and a first bit line decoder, the first bit line decoder has a source coupled to the input terminal of the second inverter and a drain coupled to both of the first capacitor and the current mirror circuit.

Further, in the circuit for control of time for read operation, the reference device circuit may include a second capacitor and a second bit line decoder, the second bit line decoder has a drain coupled to the second capacitor and a source in connection with the current mirror circuit.

Further, the circuit for control of time for read operation may further include a sensitive amplifier circuit and a test device circuit, the sensitive amplifier circuit is in connection with the test device circuit.

Further, in the circuit for control of time for read operation, the test device circuit may include a third capacitor and a third bit line decoder, the third bit line decoder has a drain coupled to the third capacitor and a source in connection with the sensitive amplifier circuit.

Further, in the circuit for control of time for read operation, the first bit line decoder, the second bit line decoder and the third bit line decoder have a common gate.

Further, in the circuit for control of time for read operation, the current mirror circuit may include a second pMOS transistor, a third pMOS transistor in cascode with the second pMOS transistor, a third nMOS transistor and a fourth nMOS transistor in cascode with the third pMOS transistor.

The present invention is beneficial over the prior art majorly in that, by additional incorporation of a dummy device circuit and a dummy sensitive amplifier circuit, mirroring of a reference current in a reference device circuit into the dummy device circuit using a current mirror circuit, and generation of time control signals by the dummy sensitive amplifier circuit based on a current in the dummy device circuit, due to the same adaptation of the current in the dummy device circuit to the size of a test device as the reference current in the reference device circuit, the time control signals generated by the dummy sensitive amplifier circuit based on the current in the dummy device circuit are also adapted to the size of the test device. This addresses the problem of fixed time control signals arising from the use of a conventionally fabricated RC relay circuit and enables the generated time control signals to change with the size of the test device as well as Process Voltage Temperature (PVT), thereby resulting in an effective reduction in average energy consumed in read operation.

DETAILED DESCRIPTION

Circuits for control of time for read operation according to the present invention will be described in greater detail in the following description which presents preferred embodiments of the invention, in conjunction with the accompanying drawings. It is to be appreciated that those of skill in the art can make changes in the invention disclosed herein while still obtaining the beneficial results thereof. Therefore, the following description shall be construed as being intended to be widely known by those skilled in the art rather than as limiting the invention.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time-consuming but would nevertheless be a routine undertaking for those of ordinary skill in the art.

The present invention will be further described in the following paragraphs by way of example with reference to the accompanying drawings. Features and advantages of the invention will be more apparent from the following detailed description, and from the appended claims. Note that the accompanying drawings are provided in a very simplified form not necessarily presented to scale, with the only intention of facilitating convenience and clarity in explaining a few exemplary embodiments of the invention.

Figure 5:
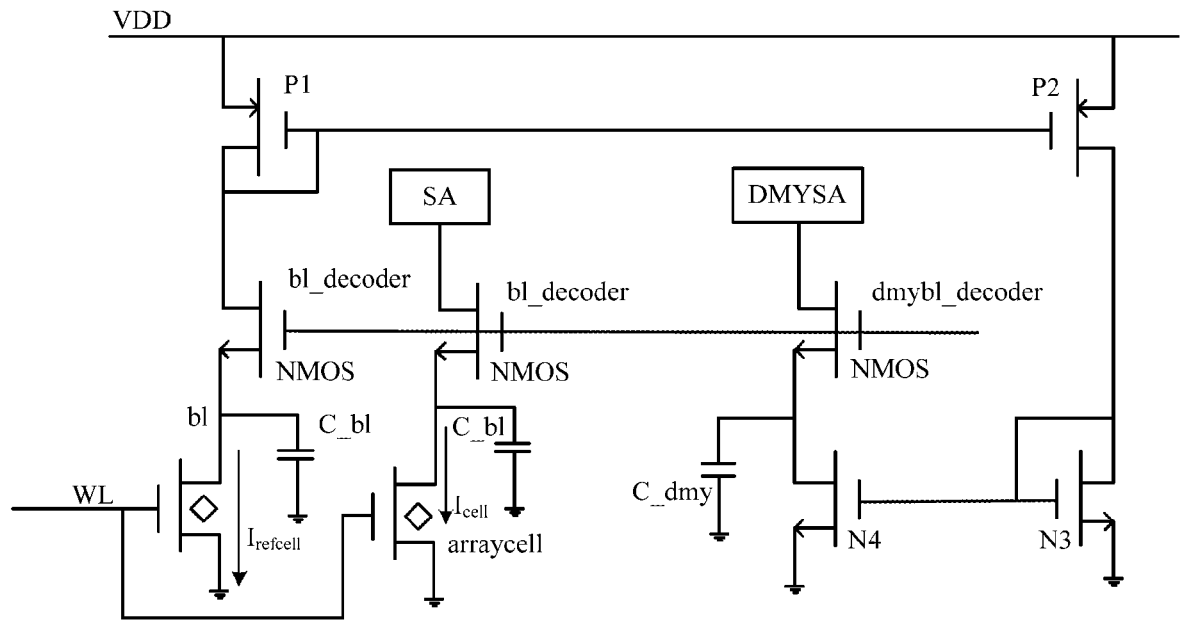
FIG. 5 is a schematic diagram of a circuit for control of time for read operation according to an embodiment of the present invention.

Referring to FIG. 5, a circuit for control of time for read operation according to an embodiment of the present invention includes a reference device circuit, a current mirror circuit, a dummy device circuit and a dummy sensitive amplifier circuit DMYSA. The current mirror circuit is configured to mirror a reference current Irefcell in the reference device circuit into the dummy device circuit. The dummy sensitive amplifier circuit DMYSA is in connection with the dummy device circuit and is configured to generate time control signals according to a current in the dummy device circuit.

Figure 6:
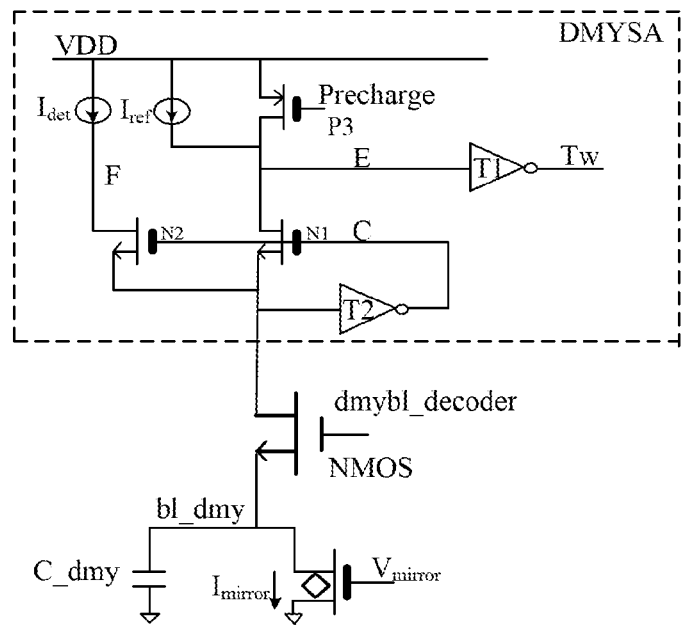
FIG. 6 is a schematic diagram of a dummy sensitive amplifier circuit according to an embodiment of the present invention.

The current mirror circuit may be implemented as a cascoded current mirror circuit including two pMOS transistors (P1 and P2) and two nMOS transistors (N3 and N4), and configured to mirror the reference current Irefcell in the reference device circuit into the dummy device circuit, thereby generating a mirrored current Imirror, as shown in FIG. 6.

The dummy device circuit may include a dummy capacitor C_dmy and a dummy decoder dmybl_decoder. Additionally, the dummy decoder dmybl_decoder has a source coupled to an input terminal of a second inverter T2 in the dummy sensitive amplifier circuit DMYSA (as shown in FIG. 6) and a drain coupled to both of the dummy capacitor C_dmy and the current mirror circuit.

The reference device circuit may include a reference capacitor C_bl and a bit line decoder bl_decoder. Additionally, the bit line decoder bl_decoder has a drain coupled to the reference capacitor C_bl and a source in connection with the current mirror circuit.

Figure 1:
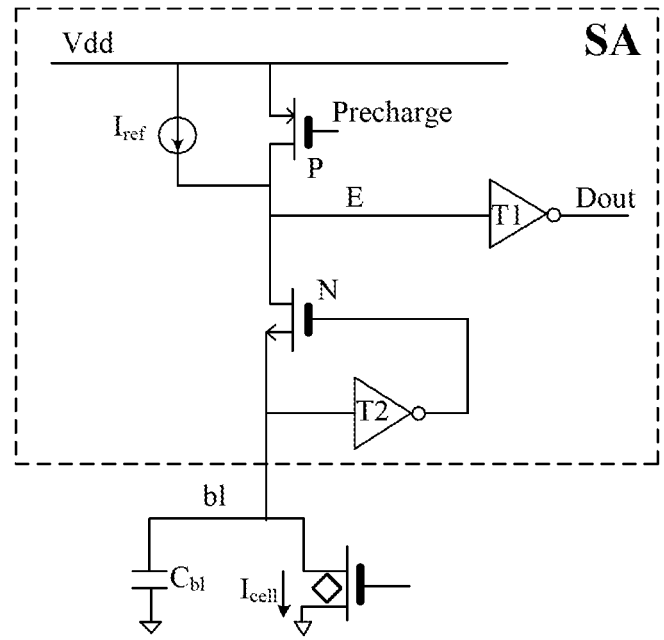
FIG. 1 is a schematic circuit diagram of a conventional sensitive amplifier circuit.
Figure 2:
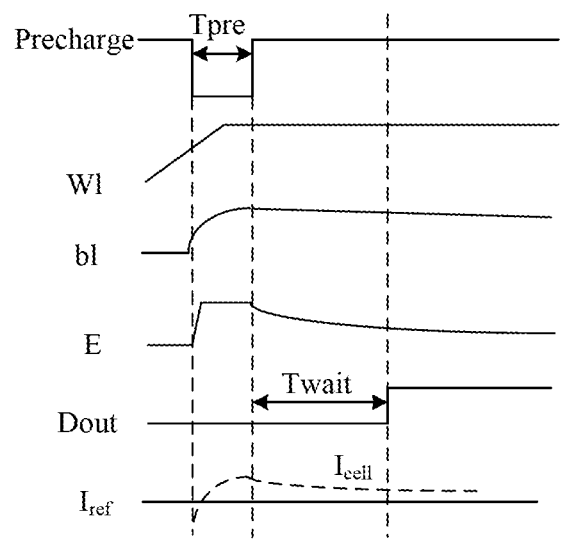
FIG. 2 shows a time sequence diagram of the conventional sensitive amplifier circuit performing a data readout operation.
Figure 3:
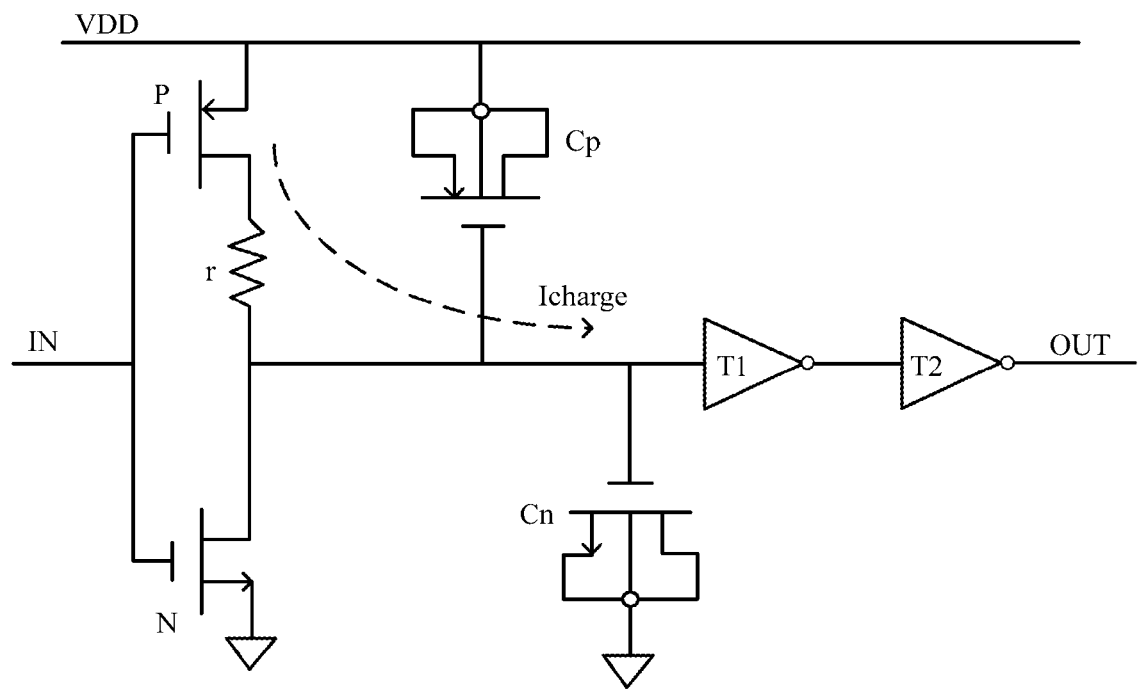
FIG. 3 is a schematic diagram of a conventional RC delay circuit.
Figure 4:
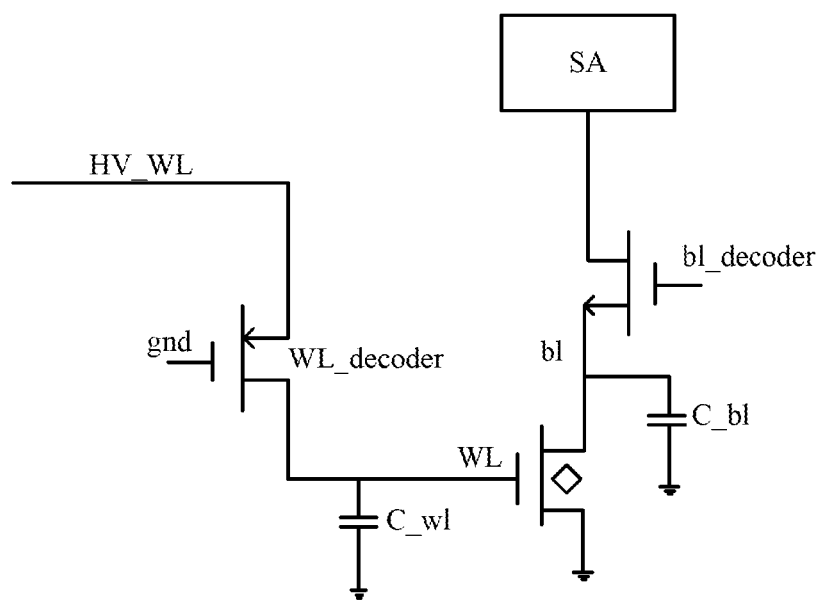
FIG. 4 is a schematic showing the conventional sensitive amplifier circuit in connection with a test device.

The circuit for control of time for read operation may further include a sensitive amplifier circuit SA and a test device circuit that is connected to the sensitive amplifier circuit SA. In fact, the test device circuit is identical to the reference device circuit in teems of structure. That is, array cells in the test device have the same size as reference cells Refcell in the reference device. They differ in that the reference cells Refcell cannot be programmed or erased and the reference current Irefcell in the reference device circuit is relative stable without disturbances, whilst the array cells in the test device circuit can be programmed and erased with the value of a current therein decreasing from the original 100% to about 30-40%. The test device circuit may include a test capacitor C_bl and a bit line decoder bl_decoder, wherein the bit line decoder bl_decoder has a drain coupled to the test capacitor C_bl and a source connected to the sensitive amplifier circuit SA. The sensitive amplifier circuit SA according to an embodiment of the present invention may be the same as the conventional sensitive amplifier circuit (as shown in FIGS. 1 and 4) without any modifications.

The bit line decoder bl_decoder of the test device circuit, the bit line decoder bl_decoder of the reference device circuit and the dummy decoder dmybl_decoder may have a common gate.

Referring to FIG. 6, the dummy sensitive amplifier circuit DMYSA may include a pMOS transistor P3, a first nMOS transistor N1, a second nMOS transistor N2, a first inverter T1 and a second inverter T2. The pMOS transistor P3 has a source coupled to a power supply voltage VDD, a drain coupled to both of an input terminal of the first inverter T1 and a source of the first nMOS transistor N1, and a gate coupled to an address control signal Precharge. The first nMOS transistor N1 and the second nMOS transistor N2 have a common gate coupled to an output terminal of the second inverter T2. The second nMOS transistor N2 has a source coupled to the power supply voltage VDD and a drain coupled to both of the drain of the first nMOS transistor N1 and an input terminal of the second inverter T2. The input terminal of the second inverter T2 is in connection with the dummy device circuit.

Figure 7:
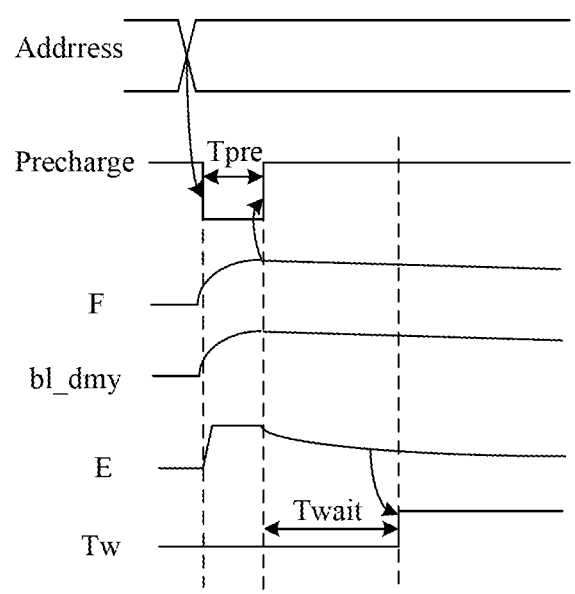
FIG. 7 shows a time sequence diagram of the generation of time control signals by a dummy sensitive amplifier circuit according to an embodiment of the present invention.

Referring to FIG. 7, in case of a change occurring in Address, the address control signal Precharge is provided to the gate of the pMOS transistor of the dummy sensitive amplifier circuit DMYSA, so that the pMOS transistor is switched on, thereby allowing the dummy capacitor C_dmy to be charged. As a result, the voltage at bl_dmy is raised, causing Vgs of the second nMOS transistor N2 to decrease until the transistor is cut off (turned off) with no pull-down current. This further causes the voltage at the source of the second nMOS transistor N2 to be raised from the level F to VDD at which a signal is generated that switches the pMOS transistor off. The dummy capacitor C_dmy is therefore fully charged, with its voltage rising to a threshold voltage of the second nMOS transistor N2 that is 0.7 V. Upon this occurring, a first time control signal Tpre is generated. After that, the mirrored current Imirror is compared with a current Iref flowing in the source of the first nMOS transistor N1. Additionally, as Imirror is greater than Iref, the level E is pulled down until it is lower than a voltage at which the first inverter T1 is inverted and generates a second time control signal Twait. Upon this occurring, a time control signal Tw is output.

As Imirror is mirrored by the current mirror circuit from the reference current Irefcell in the reference device circuit, Imirror changes with Irefcell varying when a test device with differently-sized array cells is connected. That is, Imirror varies with different test device arrays. Therefore, the time control signals generated in the above manner change accordingly and therefore better meet the process requirements.

In summary, circuits for control of time for read operation constructed according to embodiments of the present invention additionally incorporate a dummy device circuit and a dummy sensitive amplifier circuit, use a current mirror circuit to mirror a reference current in a reference device circuit into the dummy device circuit, and generate time control signals by the dummy sensitive amplifier circuit based on a current in the dummy device circuit. Due to the same adaptation of the current in the dummy device circuit to the size of a test device as the reference current in the reference device circuit, the time control signals generated by the dummy sensitive amplifier circuit based on the current in the dummy device circuit are also adapted to the size of the test device. This addresses the problem of fixed time control signals arising from the use of a conventionally fabricated RC relay circuit and enables the generated time control signals to change with the size of the test device as well as Process Voltage Temperature (PVT), thereby resulting in an effective reduction in average energy consumed in read operation.

The foregoing description presents merely several preferred embodiments of the present invention and is not intended to limit the invention in any way. Any variations such as equivalent substitutions or modifications made to the subject matter or features disclosed herein by any person skilled in the art are all considered to be within the scope of the invention.

What is claimed is:

1. A circuit for control of time for read operation, comprising: a reference device circuit, a current mirror circuit, a dummy device circuit and a dummy sensitive amplifier circuit, wherein the current mirror circuit is configured to mirror a reference current in the reference device circuit into the dummy device circuit to generate a mirrored current, and wherein the dummy sensitive amplifier circuit is in connection with the dummy device circuit and is configured to generate time control signals according to the mirrored current in the dummy device circuit, and further wherein the dummy sensitive amplifier circuit comprises a first pMOS transistor, a first nMOS transistor, a second nMOS transistor, a first inverter and a second inverter; the first pMOS transistor has a source coupled to a power supply voltage, a drain coupled to both of an input terminal of the first inverter and a source of the first nMOS transistor and a gate coupled to an address control signal; the first nMOS transistor and the second nMOS transistor have a common gate coupled to an output terminal of the second inverter; the second nMOS transistor has a source coupled to the power supply voltage and a drain coupled to both of the drain of the first nMOS transistor and an input terminal of the second inverter; and the input terminal of the second inverter is in connection with the dummy device circuit.

2. The circuit for control of time for read operation according to claim 1, wherein the dummy device circuit comprises a first capacitor and a first bit line decoder, wherein the first bit line decoder has a source coupled to the input terminal of the second inverter and a drain coupled to both of the first capacitor and the current mirror circuit.

3. The circuit for control of time for read operation according to claim 2, wherein the reference device circuit comprises a second capacitor and a second bit line decoder, wherein the second bit line decoder has a drain coupled to the second capacitor and a source in connection with the current mirror circuit.

4. The circuit for control of time for read operation according to claim 3, further comprising a sensitive amplifier circuit and a test device circuit, wherein the sensitive amplifier circuit is in connection with the test device circuit.

5. The circuit for control of time for read operation according to claim 4, wherein the test device circuit comprises a third capacitor and a third bit line decoder, wherein the third bit line decoder has a drain coupled to the third capacitor and a source in connection with the sensitive amplifier circuit.

6. The circuit for control of time for read operation according to claim 5, wherein the first bit line decoder, the second bit line decoder and the third bit line decoder have a common gate.

7. The circuit for control of time for read operation according to claim 1, wherein the current mirror circuit comprises: a second pMOS transistor, a third pMOS transistor in cascode with the second pMOS transistor, a third nMOS transistor and a fourth nMOS transistor in cascode with the third pMOS transistor.

\* \* \* \* \*